(12) United States Patent
Mai et al.

(10) Patent No.: US 9,040,128 B2
(45) Date of Patent: May 26, 2015

(54) PHOTOPLATING OF METAL ELECTRODES FOR SOLAR CELLS

(75) Inventors: Ly Mai, Sefton (AU); Alison Maree Wenham, Cronulla (AU); Stuart Ross Wenham, Cronulla (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 452 days.

(21) Appl. No.: 13/505,518

(22) PCT Filed: Nov. 3, 2010

(86) PCT No.: PCT/AU2010/001460
§ 371 (c)(1),
(2), (4) Date: Jul. 30, 2012

(87) PCT Pub. No.: WO2011/054036
PCT Pub. Date: May 12, 2011

(65) Prior Publication Data
US 2012/0282731 A1 Nov. 8, 2012

(30) Foreign Application Priority Data
Nov. 3, 2009 (AU) .................. 2009905355

(51) Int. Cl.
*B05D 3/06* (2006.01)
*C25D 5/18* (2006.01)
*H01L 31/0224* (2006.01)
*C25D 17/00* (2006.01)
*C25D 5/00* (2006.01)
*C25D 7/12* (2006.01)

(52) U.S. Cl.
CPC .......... *C25D 5/18* (2013.01); *H01L 31/022425* (2013.01); *C25D 17/001* (2013.01); *C25D 5/006* (2013.01); *C25D 7/126* (2013.01); *Y02E 10/50* (2013.01)

(58) Field of Classification Search
USPC .............. 136/256, 259; 427/74, 581; 429/111
See application file for complete search history.

(56) References Cited

U.S. PATENT DOCUMENTS

| 4,144,139 A | * | 3/1979 | Durkee ........................ 205/86 |
| 4,251,327 A | | 2/1981 | Grenon |
| 2008/0035489 A1 | * | 2/2008 | Allardyce et al. ............ 205/263 |

FOREIGN PATENT DOCUMENTS

CN 100533785 C 8/2009
EP 1865563 A2 12/2007

(Continued)

OTHER PUBLICATIONS

The International Search Report and Written Opinion dated Jan. 13, 2011.

(Continued)

*Primary Examiner* — David Vu
(74) *Attorney, Agent, or Firm* — Thomas Horstemeyer, LLP

(57) ABSTRACT

A method of photoplating a metal contact onto a surface of a cathode of a photovoltaic device is provided using light induced plating technique. The method comprises: a) immersing the photovoltaic device in a solution of metal ions, where the metal ions are a species which is to be plated onto the surface of the cathode of the photovoltaic device; and b) illuminating the photovoltaic device, using a light source of time varying intensity. This results in nett plating which is faster in a direction normal to the surface of the cathode than in a direction in a plane of the surface of the cathode.

20 Claims, 6 Drawing Sheets

(56) References Cited

FOREIGN PATENT DOCUMENTS

| | | | |
|---|---|---|---|
| EP | 2020687 | A1 | 2/2009 |
| WO | 9936599 | A1 | 7/1999 |

OTHER PUBLICATIONS

Chinese Office Action dated Oct. 17, 2014; 3 pages for application 10321433000.

* cited by examiner

PHOTOPLATING OF METAL ELECTRODES FOR SOLAR CELLS

CROSS REFERENCE TO RELATED APPLICATION

This application is the 35 U.S.C. §371 national stage of PCT application PCT/AU2010/001460, filed Nov. 3, 2010, which claims priority to and the benefit of Australian Patent Application No. 2009905355, filed on Nov. 3, 2009, both of which are hereby incorporated by reference in their entireties.

INTRODUCTION

The present invention relates generally to the manufacture of photovoltaic devices and in particular the invention provides improvements to metal plating methods for contact formation and their use in photovoltaic device manufacture which by way of example will be described with reference to solar cell manufacture.

BACKGROUND

Solar cells in general require two metal contacts to the semiconductor material, one of each polarity, to allow light generated charge from within the solar cell to be extracted and allowed to flow in external electrical wires as electricity. Most solar cells have one polarity of contact on the top surface and the opposite polarity metal contact on the rear surface. For example, in general, silicon solar cells have different metals for the front and rear contacts due to the different requirements when contacting n-type and p-type silicon. In addition, other attributes of the metal such as its electrical conductivity and thermal expansion coefficient as well as its cost affects, whether a metal is suitable and/or preferable as a metal contact on one or the other of the solar cell surfaces, must be considered. In general most silicon solar cells use different metals on a light receiving surface where shading losses, metal conductivity and contact resistance to the semiconductor are particularly important. On a non-light receiving surface where higher metal coverage and lower conductivity can be tolerated and where the polarity is opposite to the light receiving surface, other metals are usually preferable. For this reason, most screen-printed solar cells use high conductivity silver despite its high cost for the n-type front metal grid and cheaper aluminium to cover most of the p-type rear surface.

An alternative approach which may be used to apply metal contacts to a solar cell is via electroless plating, electroplating with electrodes or light induced plating (LIP). One common problem with metal contacts formed to solar cell surfaces via these techniques is that the plating solutions have a high density of metal ions such that, when plating the metal nucleates at a particular site on the semiconductor surface, and that location then becomes the preferable site for continuing rapid plating which is fed from the high concentration of metal ions available in the solution. Unfortunately the already plated surface provides the most attractive site for further metal ion deposition making it difficult for plating to nucleate at other locations of the semiconductor surface. This leads to such locations plating upwards and outwards relatively quickly, with juxtaposed regions joining as the metal plates across the semiconductor surface rather than nucleating further growth from the surface. The result is relatively poor adhesion and contact resistance between the plated metal and the semiconductor surface.

Another common problem of prior. plating techniques is that they often lead to both polarities of silicon being plated with the same type of metal, rather than allowing the use of the most desirable metal for each contact. For example, with the LIP process, metal in electrical contact with the positive electrode of an illuminated solar cell can be transferred via a conductive liquid electrolyte to the n-type negative electrode where the metal is deposited/plated onto the exposed surface. This process is described in detail by Lawrence Durkee in U.S. Pat. No. 4,144,139 "Method of Plating by Means of Light". As described by Durkee, one limitation of the LIP method is that it restricts the solar cell design to one that utilises the same metal for both polarities of electrodes. A second limitation is that it causes corrosion of the positive electrode metal towards the edges of the device due to its closer proximity to where the metal is to be deposited onto the negative electrode, which in turn leads to deterioration in the electrical conductivity of the metal contact to p-type material particularly towards the edges of the metal contact material. Both these limitations are unacceptable when fabricating high performance solar cells, with virtually all current commercial solar cells requiring different metals for the two polarities of metal contacts.

Another limitation of most LIP and electroless plating processes is that the growth rate tends to be conformal at best leading to the plating rate being more or less at a uniform rate in each direction. For many other applications this may be suitable, but for high efficiency solar cells, since shading of the top surface is roughly proportional to the width of the metal lines, it is desirable to have enhanced aspect ratios whereby the lines are as high as possible while being as narrow as possible. Conformal plating tends to result in the width of the metal lines increasing at a rate twice that at which the height increases, and results in outcomes such as that of the metal cross-section illustrated in FIG. 1 where the initial surface to be plated was 10 microns wide and which after conformal plating for about 10 minutes produced about 10 microns of plating in every direction, or equivalently a height of 10 microns but a width of about 30 microns.

SUMMARY

According to a first aspect a method is provided for photoplating a metal contact onto a surface of cathode of a photovoltaic device, the method comprising:
  a) immersing the photovoltaic device in a solution of metal ions, the metal ions being a species which is to be plated onto the surface of the cathode of the photovoltaic device;
  b) illuminating the photovoltaic device, using a light source of time varying intensity, whereby nett plating is faster in a direction normal to the surface of the cathode than in a direction in a plane of the surface of the cathode.

The use of variations in the light intensity in conjunction with the capacitance of the plating solution may be used to enhance the plating rate perpendicular to the wafer surface compared to the direction in the plane of the wafer surface. This aspect ratio control may be enhanced through the use of deplating that results during periods of reduced light intensity in regions of the device where reverse current flow can occur through the photovoltaic device to reverse the plating process. The light source of time varying intensity is preferably a pulsed light source.

Shunted and defected regions are an example where such reverse current flows can occur. Shunts may be deliberately formed in the photovoltaic device in regions where deplating is desired, by laser heating regions of the photovoltaic device to modify a dopant distribution in a column through the photovoltaic device. Deliberate use of shunts and defects in regions immediately adjacent to the region being plated can enhance deplating in these regions to minimise widening of the metal lines being plated. A total resistance of shunts in the photovoltaic device, determined as a parallel combination of all individual shunts in the photovoltaic device, is preferably greater than 100 times an open circuit voltage of the photovoltaic device ($V_{OC}$) divided by a short circuit current of the photovoltaic device ($I_{SC}$).

According to a second aspect a method is provided for photoplating a contact onto a cathode of a photovoltaic device, the method comprising:
  a) immersing the photovoltaic device in a solution of metal ions, the metal ions being a species which is to be plated onto the cathode of the photovoltaic device;
  b) illuminating the photovoltaic device,
wherein for any given intensity of illumination falling on the photovoltaic device, resistivity of the solution of metal ions is selected to cause the photovoltaic device to operate at a point on an I-V characteristic curve of the photovoltaic device between a maximum power point voltage and an open circuit voltage.

Enhanced uniformity of the nucleation of metal plating (such as with Nickel) onto the n-type silicon may be achieved through control of the conductivity of the plating solution via the concentrations of metal ions and acid. The resistivity of the solution of metal ions is preferably selected to cause the photovoltaic device to operate at a point on the I-V characteristic curve of the photovoltaic device which is closer to the open circuit voltage Voc than to the maximum power point voltage.

Reduced metal ion concentration, in addition to helping control the plating solution conductivity, may provide superior light transmission properties, therefore allowing more light to get to the photovoltaic device, and therefore boosting both its current and voltage to also enhance the LIP process. Depending on other factors the reduced metal concentration may also enhance the uniformity of plating nucleation by starving the first regions to nucleate of metal ions and therefore prevent the rapid growth that otherwise can obstruct plating from nucleating in other locations.

According to a third aspect a method is provided for of photoplating a contact onto a cathode of a photovoltaic device, the method comprising:
  a) placing a sacrificial metal electrode in electrical contact with an anode of the photovoltaic device the sacrificial metal electrode comprising a metal of the species to be plated onto the cathode of the photovoltaic device;
  b) immersing the photovoltaic device and sacrificial metal electrode in a solution of metal ions, the metal ions being of the species which is to be plated onto the cathode of the photovoltaic device;
  b) illuminating the photovoltaic device,
wherein metal is preferentially sacrificed from the sacrificial metal electrode, rather than from a metal contact of the anode of the photovoltaic device, to form metal ions in the solution of metal ions and ions from the solution of metal ions are reduced to plate the cathode of the photovoltaic device.

This LIP technique allows a different metal to be used in each polarity of contact. With multiple metals in contact with or comprising the anode (at the p-type contact), differences in the electrochemical potentials may be used to preferentially determine which metal participates in the LIP process and therefore releases positive metal ions into the plating solution to be reduced at the cathode and hence plate the n-type contact.

In some cases the metal contact of the anode may be formed of a metal which is more electropositive than the metal of the sacrificial metal electrode in which case the anode metal contact may be coated with a protective coating to allow the preferential sacrifice of metal from the sacrificial metal electrode. The protective coating may be for example an oxide of the metal of the anode metal contact. By oxidising the more reactive of the two metals, its participation in the LIP process is prevented, therefore allowing the less reactive metal to be the one that releases the metal ions into the solution to plate to the n-type contact.

The three aspects of the invention may be used together in a single embodiment of the invention.

BRIEF DESCRIPTION OF THE DRAWINGS

Embodiments of the photoplating method will now be described with reference to the accompany drawings in which.

DETAILED DESCRIPTION OF IMPROVED LASER OPERATIONS

New approaches for the plating of contacts on solar cells are described herein based on light induced plating (LIP) methods which ameliorate some or all of the difficulties experienced with prior methods. Excellent adhesion may be obtained between the plated metal and the semiconductor surface while high aspect ratios for the metallisation may also be achieved through producing average plating rates in the direction perpendicular to the semiconductor surface that may be up to four times greater than the plating rates parallel to the surface that cause widening of the lines. These approaches may also allow different metals to be used on contacts to different polarity semiconductors while simultaneously avoiding corrosion of either metal contact during the plating process. It is also possible with these approaches to avoid the need for external power sources or any external electrodes to contact the solar cell.

Figure 2:
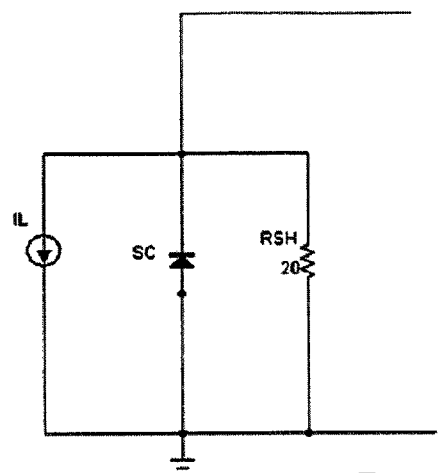
FIG. 2: Simplified circuit of an ideal solar cell except with shunt $R_{SH}$
Figure 3:
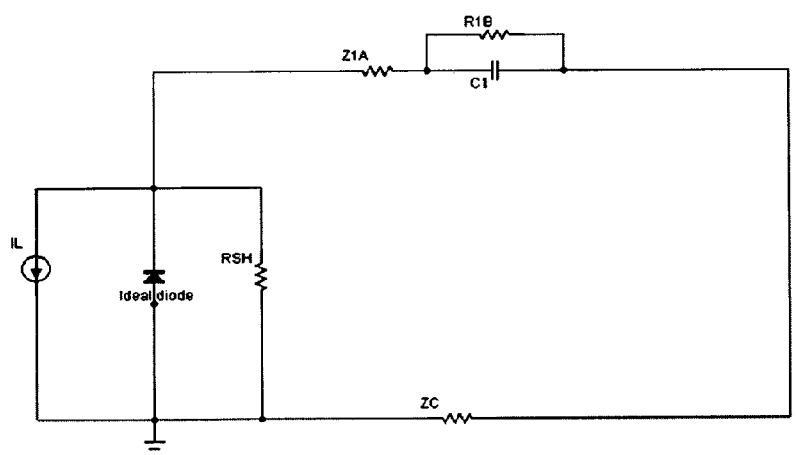
FIG. 3: Simplified circuit representing the light induced plating of n-type contacts onto a solar cell

To understand the LIP process, the following example uses a copper positive electrode immersed in a copper sulphate solution to plate a copper n-type contact. The copper electrode is in electrical contact with the p-type semiconductor material of the solar cell. FIG. 2 shows an equivalent circuit of a solar cell, including an ideal diode D, a shunt resister $R_{SH}$ and a current source simulating a source of light generated current $I_L$ which is approximately proportional to both the light intensity and also the area of the solar cell. In FIG. 2, parasitic series resistances have been neglected. When the illuminated cell is immersed within the conductive copper sulphate plating solution, current generated by the solar cell flows through the conductive plating solution. Electrons at the n-type semiconductor surface combine with Cu2+ ions in the solution to cause Cu atoms to form on the exposed n-type surface. The chemical reaction involving this exchange of electrons is represented in FIG. 3 by the impedance $R_{1A}$ such that an increased potential drop across this interface is required for increased plating rate. At the positive copper electrode, positive charge is released into the solution by copper atoms relinquishing electrons into the p-type silicon leading to the formation of Cu2+ ions which are soluble in the solution. This reaction can also be represented by an impedance $Z_{1C}$ also shown in FIG. 3. These copper ions are then free to move by diffusion in response to the concentration gradient established between the higher concentration of Cu2+ ions in the vicinity of the p-type material contact and the diminished concentration of Cu2+ ions near the n-type material contact where the Cu atoms are formed as the n-type polarity solar cell contact. This flow of positive charge in response to the concentration gradient completes the circuit, allowing the current generated by the solar cell to flow. This flow by diffusion can also be represented by a resistor as indicated by $R_{1B}$ in FIG. 3 which has a relatively large value due to the challenge and long distance for the Cu ions to diffuse to equalise the charge distribution non-uniformities. In parallel with this resistor is a relatively large capacitor representing the solution's ability to store charge in the vicinity of the two electrodes immediately following the illumination of the cell. With a DC light source, except for the initial transient when the light source is first turned on, the capacitance has no role to play.

DETAILS OF THE PHOTOPLATING METHOD

The present work provides improvements to the LIP process which individually and/or collectively address issues of corrosion of the positive electrode, the inability to use different metals for the two contacts, the poor adhesion and contact resistance that result from non-uniform nucleation of the plating process and the inability to enhance the growth rate of the height of the metal to exceed 0.5 times the growth rate of the metal line widths.

Figure 4:
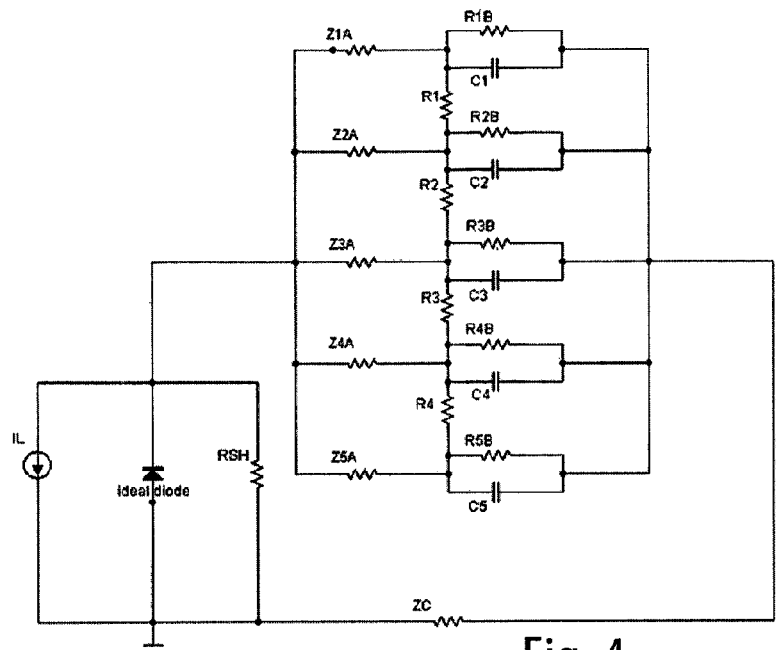
FIG. 4: More sophisticated equivalent circuit representing the light induced plating of an n-type metal contact onto a solar cell

Firstly, to understand the non-uniform nucleation of plating at isolated locations of the n-type semiconductor surface, in the equivalent circuit shown in FIG. 4 we represent each separate location on the n-type surface by an independent impedance ($Z_{1A}$, $Z_{2A}$, $Z_{3A}$ etc) of independent value that represents the difficulty in nucleating the plating in each of those locations. With commonly used plating solutions with large amounts of metal ions such as Cu2+, the Capacitor values $C_1$, $C_2$, $C_3$ etc are correspondingly large so that when the cell is illuminated, large currents can potentially flow until the metal ions near the surface of the n-type semiconductor are depleted. At this point in time it is equivalent to the capacitors having been fully charged to a sufficiently high voltage so as to retard further current flow through the capacitor. A small current continues to flow however as Cu2+ ions from the vicinity of the positive electrode diffuse to the depleted regions in the vicinity of the n-type contact. These current flows can be represented by resistors $R_{1B}$, $R_{2B}$, $R_{3B}$ etc in parallel with $C_1$, $C_2$, $C_3$ etc as shown in FIG. 4. Resistors R1, R2, R3, etc reflect the potential for Cu2+ ions near one region of the n-type surface to diffuse to adjacent areas where concentrations are lower. The problem with the circuit of FIG. 4 though lies in the fact that variations in the respective impedance values $Z_{1A}$, $Z_{2A}$, $Z_{3A}$ etc at the n-type surface can lead to large variations in current through these respective impedances and hence large differences in the plating rate. This non-uniformity appears to be exacerbated by the fact that once plating nucleates through a given impedance Zi, the metallised surface in that location becomes a preferred site for further plating meaning that Zi effectively reduces in impedance in that location and therefore can be represented by a time varying impedance. This time varying impedance combined with the large capacitor values allows some regions to rapidly plate large amounts of metal while other locations effectively fail to nucleate plating. Juxtaposed rapid plating regions therefore join by plating horizontally across the wafer surface, leaving relatively low contact area between the metal and the silicon and corresponding poor adhesion and high contact resistance. This non-uniformity may be overcome in several ways by manipulating the plating solutions:

the copper ions are removed from the solution (or at least greatly reduced in concentration) so as to greatly reduce the C values. This allows the capacitors to rapidly charge to close to the voltage generated by the solar cell when it is illuminated. This in turn prevents the high plating rates in the locations where plating first nucleates.

The conductivity of the solution is controlled by adding a small amount of acid to the water into which the cell to be plated is immersed. This allows the control of resistor values $R_{1B}$, $R_{2B}$, $R_{3B}$ etc so that these values can be chosen in conjunction with impedance values $Z_{1A}$, $Z_{2A}$, $Z_{3A}$ etc so that more uniform currents will flow through the latter despite variations in the values of the latter. To achieve this, the "B" series resistors are chosen to have larger values than their respective "A" series counterparts which, cannot be controlled. Although much slower plating rates result, this strategy forces quite uniform currents to flow through the respective resistors and hence equivalently quite uniform plating rates at the various corresponding surface locations of the semiconductor, preventing the intermittent plating of isolated regions and therefore providing low contact resistance and good metal adhesion. These values of $R_{1B}$, $R_{2B}$, $R_{3B}$ etc are controlled by controlling the conductivity of the plating solution. Although not shown in FIG. 4 (where only an ideal solar cell is shown with a shunt resistor in parallel), different regions of the cell can also be of different quality in terms of the ability to produce current and voltage when illuminated. For example localised shunting can drag down the voltage in localised regions leaving relatively large areas devoid of plating. To a large extent, such non-uniformities can be overcome by increasing the voltage across the cell. Since no external power supply is being used in this process, the cell voltage can be increased by cooling the solution, increasing the intensity of the light source (at least while plating nucleates), using a more transparent plating solution by eliminating the metal ions, and increasing the resistance of the solution while reducing its capacitance to force the, cell to operate closer to its open circuit voltage or any combination of the above.

Note that throughout this specification, where components of an equivalent circuit are referred to as being varied, it will be recognised that in fact physical characteristics of the system are being varied, resulting in a variation of the equivalent circuit and where components are referred to as conducting or charging etc, it will be recognised that the description is intended to convey the meaning that the system, of which the equivalent circuit is a representation, is in fact displaying the respective characteristics (i.e. conducting, charging etc.) and the characteristics of the material, device or system are simply being described with reference to the equivalent circuit for ease of understanding.

Each of the above provides improved uniformity for nucleating plating of the exposed n-type silicon surface, but does so at the expense of greatly reducing the plating rate. This is not a problem since this strategy is only used to plate an initial very thin metal layer of say Ni or Cu or Ag to give good uniformity following which the plating solution can be modified to give faster plating with improved aspect ratio.

Secondly, once plating has uniformly nucleated over the exposed n-type surface, improved aspect ratios for the plating can be achieved by manipulating the various capacitor values and varying the light source strategically. This can be done to allow the capacitors in some regions to fully charge during illumination and therefore restrict the plating rate in those locations, followed by a period of no or low light intensity that allows the capacitors to discharge and to simultaneously facilitate enhanced deplating of the regions that would be otherwise causing the metal line widths to increase. This strategy relies on controlling the concentration of the plating solution to control the magnitude of the capacitors, but also the depth of the solution above the solar cell and the geometry/location of the metal lines relative to each other so as to allow some capacitors to be of different values relative to the others. In particular, by engineering lower values for the solution capacitance in the regions of the edges of the metal lines that cause the metal lines to widen and higher values for the capacitance in the vicinity of the central/top regions of the metal lines that affect the vertical/height growth rate, the metal aspect ratio can then be enhanced as described via the control of the light intensity and its pulsing frequency. This retarding of the average plating rate at the edges of the metal lines can be enhanced by introducing controlled amounts of localised shunting in these regions such as through the use of the laser doping process to heavily dope the silicon directly beneath the metal lines.

For example, lets assume C1 and C5 represent the solutions at the sides of the metal lines being plated which provide the source of metal ions that cause the metal lines to increase in width and that these capacitor values are kept significantly smaller than C2 to C4 by control of the geometry/location of the metal lines, the depth of solution and its concentration of metal ions. By subsequently pulsing/varying the light source whereby each pulse is of the right duration and at the right intensity, C1 and C5 reach their maximum state of charge relatively quickly compared to C2 to C4, therefore preventing significant further charge from flowing through C1 and C5 to plate the edges of the metal lines. During the latter part of the pulse however, C2 to C4 continue to store charge, with the current continuing to flow and therefore continuing the plating process for the top surface of the metal lines in the direction upwards, perpendicular to the wafer surface. It is preferable for the intensity of the light and the duration of each pulse to be chosen so that not only do C1 and C5 quickly reach full state of charge, but that C2 to C4 don't reach their full state of charge. This means that when each light pulse finishes and the light intensity falls, a higher voltage is maintained across C1 and C5 than across the other capacitors. In FIG. 4, the cessation of the light pulse is equivalent to $I_L$ falling to zero or some significantly smaller value. This allows charge to flow back through the solar cell in the reverse direction, being driven by the voltage across the capacitors C1 to C5. Since C1 and C5 in the ideal situation have higher voltage across them when $I_L$ falls, then C1 and C5 initially preferentially discharge back through the solar cell causing deplating of some of the metal from the edges of the metal lines. To understand the deplating process, Cu atoms that had previously plated onto the n-type metal contact when electrons travelled from the n-type semiconductor into the solution, now give up their electrons in the reverse direction back into the n-type silicon to therefore release the Cu2+ ions back into the solution. This deplating at the edges of the metal lines can be enhanced by deliberately locating small amounts of shunting (defects and recombination etc extending to the junction) of the solar cell junction in these regions, whereby the shunting is sufficient to enhance deplating and retard the average plating rates in these regions, but insufficient to significantly damage the electrical performance of the solar cell when operating at its maximum power point in bright sunshine. To ensure the latter, the total shunt resistance of the cell (formed by all the individual shunts in parallel) is preferably greater than 100 times the characteristic resistance of the cell given by the ratio of the open circuit voltage Voc divided by the short circuit current Isc (where Voc and Isc are determined under standard test conditions). The presence of localised shunts immediately adjacent to the metal lines being plated can be formed such as through the use of lasers. For example, in the laser doping process to create a selective emitter, the laser can be used to melt and heavily dope the silicon directly beneath the metal/silicon interface, while simultaneously generating defects and shunting immediately adjacent to the molten regions where the silicon was not hot enough to melt and instead can be made to sustain defects and damage that creates a controllably small amount of shunting of the junction. The value of these localised shunts/recombination can be controlled via the laser parameters including the laser power, its pulsing frequency and the pulse duration and shape. For example pulsing the silicon during laser melting with a pulse frequency low enough to allow the molten silicon to resolidify prior to the next pulse, exacerbates the stress in the regions juxtaposed to the molten regions and therefore enhances the generation of defects/shunting. In this case, the amount of shunting can be, directly controlled by the number of such pulses incident on each location.

Figure 1:
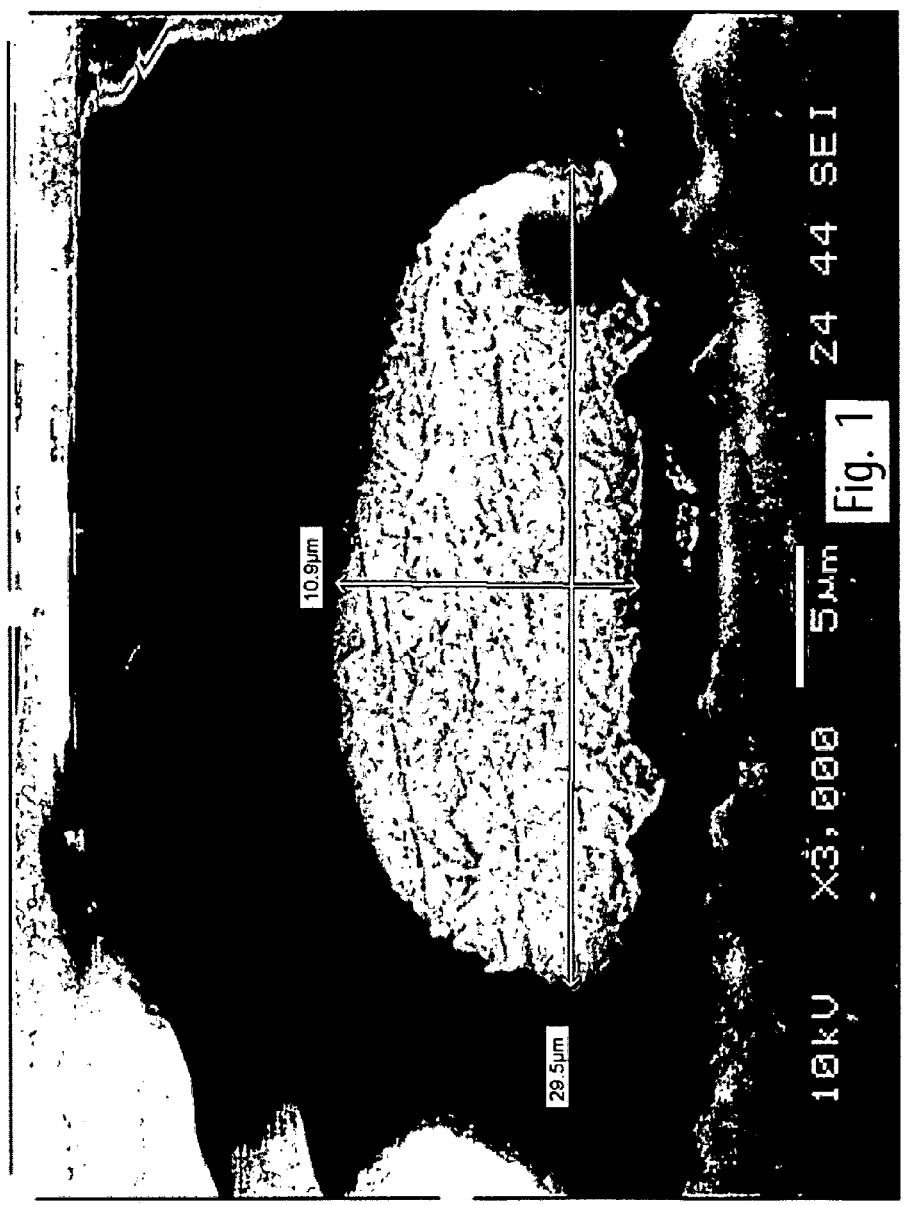
FIG. 1 Conformal plating of a 10 micron wide laser doped line to provide plating of 10 microns of metal in all directions to give a metal line height of about 10 microns and a line width of about 30 microns.
Figure 5:
FIG. 5: Enhanced aspect ratio for the light induced plating using a pulsed light source

In combination, the preferential deplating of the edges and the enhanced plating rate in the direction perpendicular to the cell surface through the combination of pulsing the light, the presence of localised shunting and the manipulation of the capacitor values, can give significantly faster average plating rates in the direction of increasing the height of the metal lines compared to their width. FIG. 5 for example shows a Focused Ion Beam (FIB) photograph of a metal line formed through the use of such plating strategies to plate a 12 micron wide line of n-type semiconductor material. The heavily doped surface to be plated was prepared by the laser doping process using a Q-switched frequency of 100 kHz which allowed sufficient time between pulses for the molten silicon to resolidify. The plating solution was concentrated copper sulphate solution near the solubility limit with a small amount of sulphuric acid and a depth of solution above the cell surface of 1 cm. Following plating for about 8 minutes with a 100 Hz pulsed light source of average 100 mW/cm2 intensity at the surface of the plating solution and 30-40 mW/cm2 at the surface of the silicon cell, the metal line was a near perfect semicircle of radius 12 microns as shown. This represents an average growth rate vertically to the surface of about 1.5 microns/min while the horizontal growth rate causing the widening of the metal lines was restricted to about 0.4 microns/min. This compares particularly favourably to the more conventional conformal plating processes as typically shown in FIG. 1 where the plating rate both vertically and horizontally was about 1 micron/min.

Figure 6:
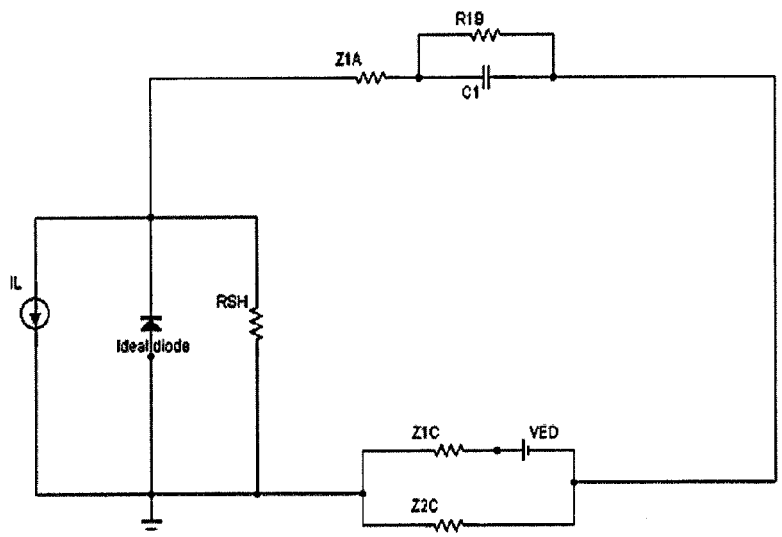
FIG. 6: Modification of the equivalent circuit of Figure. 3 to incorporate protection for the positive electrode at the rear of the solar cell through the inclusion of a sacrificial electrode represented by $Z_{2C}$ which corrodes preferentially due to its greater electronegativity.

Thirdly, an approach has been developed that prevents corrosion of the positive electrode by placing another metal in contact with it that is significantly more electropositive. For example if the positive electrode is silver, then this latter sacrificial metal could be any metal that is significantly more electropositive such as aluminium so as to protect the silver positive electrode metal by preferentially giving up electrons into the solar cell during the photoplating (light induced plating). This can avoid much of the corrosion of the positive electrode by avoiding it releasing as many positive metal ions into the solution. Provided this sacrificial metal is in good electrical contact with the positive electrode and has a more negative electrochemical potential than the metal being protected, the sacrificial metal gives up electrons into the semiconductor material, thereby releasing positive metal ions into the electrolyte that are then able to diffuse to the negative electrode where they are able to complete the circuit by receiving electrons from the n-type material to coat the surface with metal atoms. To represent this chemical reaction in the equivalent circuit of FIG. 3 for example, we can replace $Z_C$ with two resistors in parallel, $Z_{1C}$ and $Z_{2C}$, where $Z_{1C}$ represents the chemical reaction associated with the positive electrode when it gives up electrons into the semiconductor material, thereby releasing positive metal ions into the electrolyte. Similarly, $Z_{2C}$ represents the equivalent chemical reaction but involving the sacrificial metal that is more electropositive than the positive electrode. In this case, as shown in FIG. 6, a DC voltage source $V_{ED}$ is placed in series with $Z_{1C}$ to represent the magnitude of its electrochemical potential compared to that of the sacrificial metal. Analysis of this circuit shows that the addition of the voltage source $V_{ED}$ can protect $Z_{1C}$ from current flow and hence corrosion. However, if the current through $Z_{2C}$ is too large or the value of $Z_{2C}$ is too large (such as can be caused by oxidation of the metal surface or less favourable location or geometry/shape of the positive electrode relative to the sacrificial metal), then some current will be caused to flow through $Z_{1C}$ and hence cause some corrosion of the positive electrode.

Fourthly, the described approach allows different metals to be used for the two solar cell electrodes. If two different metals (with two different electrochemical potentials) form, or are in contact with, the positive electrode of the solar cell, then appropriate pre-treatment prior to the LIP process can facilitate either metal being transferred to the n-type silicon thereby forming the negative electrode. As described above in 3, without pre-treatment the metal with the more negative (less positive) electrochemical potential will corrode (i.e., oxidise resulting in the generation of metal ions in the electrolyte) while the metal with the higher electrochemical potential (less negative) will remain on the positive electrode. However to do the reverse, a pre-treatment such as an oxidation process can be used to create a thicker protective insulating layer on the more electropositive metal that therefore allows the less electropositive metal to predominantly participate in the LIP process and release positive metal ions into the plating solution that can get transferred onto the negative electrode. This approach works because of the strong link between the electropositivity of a metal and how reactive the metal is in growing a thick protective insulating oxide layer during oxidation. To prevent cross contamination of metals, it is desirable to use a plating solution that contains metal ions the same as the metal used as the sacrificial metal that protects the positive electrode. For example, aluminium is commonly desired as the positive metal contact for a solar cell due to the fact that aluminium is a valency 3 element that is therefore able to dope the silicon p-type. However, because metals such as silver and copper are more suitable than aluminium as negative electrode metals, then it is advantageous to use these metals as sacrificial metals on the positive (aluminium) electrode. So if, for example, copper is to be used as the negative electrode metal, then copper can be placed in contact with the aluminium electrode such as by screen printing the copper onto or adjacent to the aluminium or through the application of mechanical pressure between a piece of copper and the aluminium or by another suitable technique that facilitates electrical contact between the copper and the aluminium. Following oxidation, the aluminium oxide layer protects the aluminium from the electrolyte and significantly retards its dissolution when the cell is illuminated and immersed into a plating solution containing for example copper sulphate. In comparison, if a metal mixture is desired for the n-type contact, multiple sacrificial metals could be used in contact with the positive electrode whereby the level of oxidation of the metal surfaces, the relative electrochemical potentials and the physical locations/shape of the various metals determine relative amounts of the various metals to plate onto the negative contact. Furthermore, the metal ions contained within the plating solution also participate within the plating reaction and comprise part of the metal forming the negative contact. Therefore, if desired, different metal ions (or even a variety of metal ions) can be contained within the plating solution from those used in contact with the positive electrode to also give variations in composition of the negative electrode. For example, a small amount of silver within a copper electrode appears to significantly enhance its resistance to damage from chemical oxidation processes.

A simple way to implement embodiments of the photoplating method is to coat regions of the positive aluminium contact with the sacrificial metal such as nickel, silver or copper, by a technique such as screen printing, ink jet printing, painting, gluing, spraying etc. Following oxidation either by heating in oxygen or appropriate chemical treatment to preferential grow a protective insulating layer on the more electropositive aluminium surface, the cell is then immersed in a suitable electrolyte such as copper sulphate (if the sacrificial metal is copper), and illuminated with a light source, then the copper atoms in contact with the aluminium preferentially release electrons into the semiconductor thereby creating Cu2+ ions within the electrolyte and protecting the aluminium from being oxidised. No separate electrodes are needed in this process and so no electrical contacts need to be made to the solar cell such as are needed in conventional electroplating. Another important feature of embodiments of the photoplating method is the use of the light intensity and its variation to achieve certain desirable outcomes from plating process at the negative electrode and in particular the shape and aspect ratio of the plated metal cross-section formed. A constant intensity light source is not good for achieving the most desirable shapes for the plated metal due to the capacitance of the solution in which large amounts of positive charge are constantly being generated in the vicinity of the positive contact while effectively large volumes of negative charge are being generated at the negative electrode (by virtue of the positive metal ions receiving electrons from the negative contact and therefore disappearing from the solution). Diffusion processes are necessary to equalise out this charge distribution. However the constant generation of charge with. a constant intensity light source maintains this concentration gradient of ions with the tendency to therefore have a plating process that is diffusion rate limited (i.e. limited by the rate at which the positive metal ions generated at the positive electrode can diffuse to the negative electrode to participate in the plating process) and therefore different in cross-section than one that is surface rate limited and offers the opportunity for deplating during periods of low or no light intensity that facilitates charge equalisation within the plating solution. Such constant light intensity and diffusion rate limited plating is desirable under certain circumstances such as where a thin uniform nucleating layer of metal is required, but not where higher aspect ratios for the metal are needed.

In this approach, the light intensity is varied to better control the flow of ions within the electrolyte. For example, the light intensity needs to be held above a certain value to generate sufficient voltage across the solar cell contacts needed for the plating process. This voltage also needs to be high enough to overcome any shunting effects internal to the solar cell that are likely to try and drag down the voltage in localised regions if the light intensity is not high enough. This then generates significant concentration gradient of ions within the electrolyte due to the generation of positive and negative charge in the vicinity of the positive and negative contacts respectively. This therefore needs to be followed by a period of low or even no light intensity to retard the reaction rate at the electrode surfaces while the charge within the electrolyte diffuses to equalise out the charge distribution. This replenishes the positive charge concentration in the form of positive metal ions in the vicinity of the negative contact. Consequently, when the light intensity is restored, the plating process is reinitiated at the negative contact without limitations from the rate of diffusion of metal ions in the solution until the positive metal ion concentration is again depleted, at which time the light intensity is preferably again diminished.

Another potentially important aspect of embodiments of the photoplating method relating to the control of the light intensity is that it can be used to effectively prevent plating to badly shunted regions of the cell and therefore minimise the impact of such regions. Such regions tend not to plate as well as non-shunted regions in any case when using photoplating due to the lower surface voltages in those regions. However in addition to this, after a period of high light intensity and charge generation near the solar cell contacts within the electrolyte, reducing the light intensity rapidly to approximately zero allows the current flow to be reversed back through the solar cell, but primarily through regions where the junction is shunted. This happens by metal atoms at the negative electrode in the vicinity of a shunt giving up electrons that flow through the shunt, while the copper atoms that released the electrons return to the electrolyte as positive copper ions. The electrons passing through the shunted region then combine with positive metal ions that accumulated at the positive electrode during the period of high light intensity, therefore replating such metal ions back onto the positive electrode. In comparison, a high intensity DC light source will tend to give far more uniform plating to both shunted and non-shunted regions by eliminating any tendencies for deplating.

Further enhancement of the metal aspect ratio can be achieved by strategically locating minor shunts or defects immediately adjacent to or at the edges of the metal lines being plated to allow current reversal in these regions during periods of reduced light intensity. This effectively reduces the plating rates in the vicinity of where these shunts/defects are located, therefore reducing the tendency for the metal lines to increase in width by reducing the plating in the horizontal direction to the wafer surface in the vicinity of where the shunts/defects are located. Such shunts however have to be formed by a well controlled process such as through the use of a laser to thermally cycle the silicon in a way that stresses the silicon due to the thermal expansion mismatch between the antireflection coating (surface dielectric layer) and the silicon, therefore generating minor defects/shunts that don't severely degrade the electrical performance of the solar cell. Defects can also be generated for this purpose via a range of mechanical approaches or laser induced techniques. For example, ablating some silicon (or simply melting it) followed by rapid freezing has been shown to create. defects/dislocations/shunting of the junction in a way that enables the described aspect ratio enhancement to be achieved.

Preferred Implementations

The preferred approach is to use a two-step, plating process. In the first step, a thin layer of metal (typically 0.1-3 microns in thickness) such as nickel is initially plated onto the n-type surface. This is preferably done using a DC light source to minimise capacitive effects and any deplating tendencies and a plating solution that has very low metal ion concentration so as to maximise its transparency to the light source and to increase the resistance of the plating solution to minimise the impact of variability in the ability to nucleate plating at different points on the n-type surface. If the desired positive electrode for the solar cell is a metal that is more electropositive than nickel such as aluminium, then a sacrificial nickel electrode can be formed over the aluminium surface using, for example, screen printing. The formed nickel does not have to totally cover the aluminium and is preferably applied close to the perimeter of the solar cell to ensure a symmetrical anode that is placed as close as possible to the front surface negative electrode of the cell. Then a pre-treatment such as to preferentially oxidise the aluminium surface is applied to protect the rear surface aluminium from participation in the LIP process. If the Ni is more electropositive than the positive electrode, then no such pre-treatment is necessary since the Ni will automatically preferentially give up its positive metal ions into the plating solution during the LIP process. To carry out the LIP process, the Ni source is placed in contact with the positive electrode preferably at the rear of the solar cell and a small amount of acid such as sulphuric acid is added to the solution to give the desired conductivity. Although the plating rate is slow requiring 5-10 minutes to produce a continuous layer visible to the eye under the microscope, the uniformity and corresponding adhesion of this layer is excellent. It is usually preferable to sinter such a Ni layer at about 400° C. in an $N_2$ ambient to produce nickel silicide prior to the second plating step although if the initial Ni layer is thick enough, the sintering can be carried out at the completion of all the metal deposition to simplify the processes.

Figure 7A:
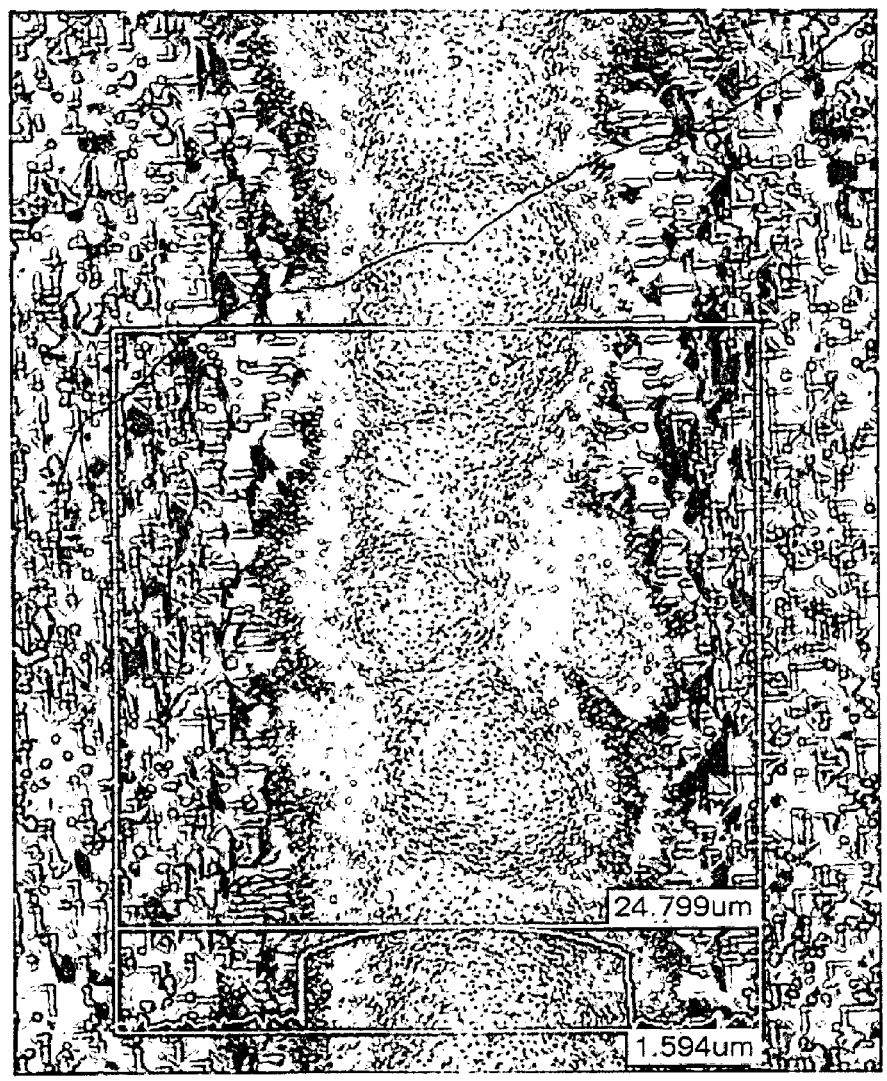
FIGS. 7(a) & (b): Enhanced aspect ratio from (a) above and (b) in cross-section for the LIP of copper contacts for a solar cell by optimising the light source and plating solution characteristics.
Figure 7B:
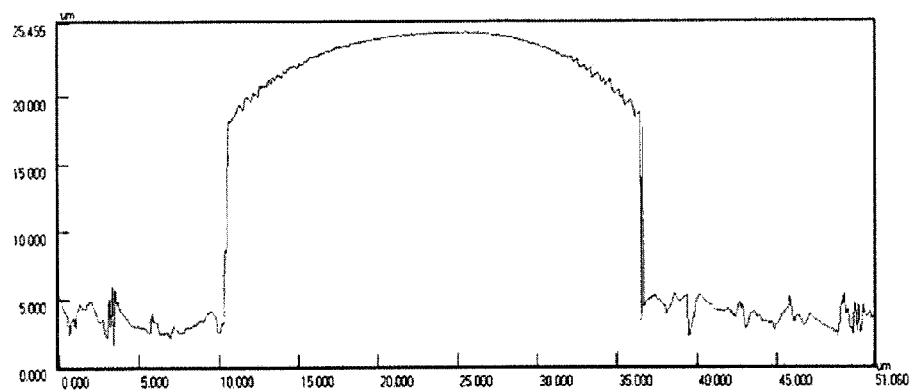

In the second plating step, a highly conductive metal such as copper is placed in contact with the positive electrode in a similar way to the Ni was above, with the same requirements for pie-treatment depending on the respective electropositivities of the copper. The positive electrode is preferably aluminium which therefore needs the pre-treatment (such as oxidation at elevated temperature) to minimise its participation in the LIP process. The pre-treatment of the aluminium prior to the LIP deposition of Ni is usually suitable also for the LIP process with the copper without any need to carry out the pre-treatment again. The cell is then immersed in the plating solution and exposed to a pulsed light source. The preferred copper plating solution is 60-250 g/L, and preferably 110 g/L copper sulphate (hydrate) with 45-225 ml/L, and preferably 210 ml/L Conc (98%) sulphuric acid added to enhance the solution conductivity. The depth of solution above the wafer surface is preferably about 0.5 to 1 cm and the light source a high powered strobe light of variable frequency and power per pulse. Adjusting the power per pulse and the frequency of the pulses allows optimisation of the aspect ratio while ensuring suitable uniformity for the plating is maintained. As shown in FIG. 7, growth rates for the height of the metal can be above triple that contributing to the width of the metal, making it possible as shown for a 12 micron wide laser doped line to be plated to a height of 22 microns while only broadening the width to 26 microns in a period of 11 minutes. This is equivalent to a plating rate perpendicular to the cell surface of 2.0 microns/min while the plating rate horizontal to the cell surface is less than one third the rate at only 0.63 microns/min.

A minor modification to the above is to use a set of standard energy efficient compact fluorescent light globes as the light source. These are lower in cost and have a spectrum well matched to the absorption properties of the copper plating solution in terms of avoiding much absorption and therefore heating within the solution. This maybe preferable for commercial implementation even though the aspect ratio achieved is a little worse due to the less optimal pulsing frequency and on:off ratio for the light source.

It will be appreciated by persons skilled in the art that numerous variations and/or modifications may be made to the invention as shown in the specific embodiments without departing from the scope of the invention as broadly described. The present embodiments are, therefore, to be considered in all respects as illustrative and not restrictive.

The invention claimed is:

1. A method of photoplating a metal contact onto an exposed semiconductor surface of a cathode of a photovoltaic device, the method comprising:
   a) immersing the exposed semiconductor surface of the cathode of the photovoltaic device in a solution of metal ions, the metal ions being a species which is to be plated onto the exposed semiconductor surface of the cathode of the photovoltaic device;
   b) illuminating the photovoltaic device, using a light source of time varying intensity, to cause plating onto the exposed semiconductor surface of the cathode of the photovoltaic device whereby nett plating is faster in a direction normal to the surface of the cathode than in a direction in a plane of the surface of the cathode.

2. The method of claim 1 wherein reversal of current direction through the solution of metal ions occurs during periods of reduced light intensity to deplete regions of the photovoltaic device where the reversed current can flow through the photovoltaic device.

3. The method of claim 2 wherein shunts are formed in the photovoltaic device in regions where deplating is desired.

4. The method of claim 3 wherein the shunts are formed by laser heating regions of the photovoltaic device to modify a dopant distribution in a column through the photovoltaic device.

5. The method of claim 4 wherein a total resistance of shunts in the photovoltaic device, determined as a parallel combination of all individual shunts in the photovoltaic device, is greater than 100 times an open circuit voltage of the photovoltaic device ($V_{oc}$) divided by a short circuit current of the photovoltaic device ($I_{sc}$).

6. The method as claimed in claim 1 wherein the light source of time varying intensity is a pulsed light source.

7. The method as claimed in claim 1 wherein for any given intensity of illumination falling on the photovoltaic device, resistivity of the solution of metal ions is selected to cause the photovoltaic device to operate at a point on an I-V characteristic curve of the photovoltaic device between a maximum power point voltage and an open circuit voltage.

8. The method of claim 7 wherein the resistivity of the solution of metal ions is selected to cause the photovoltaic device to operate at a point on the I-V characteristic curve of the photovoltaic device which is closer to the open circuit voltage Voc than to the maximum power point voltage.

9. The method as claimed in claim 1 further comprising:
   a) placing a sacrificial metal electrode in electrical contact with an anode of the photovoltaic device the sacrificial metal electrode comprising a metal of the species to be plated onto the cathode of the photovoltaic device;
   b) immersing the exposed semiconductor surface of the cathode of the photovoltaic device the photovoltaic device and sacrificial metal electrode in a solution of metal ions, the metal ions being of the species which is to be plated onto the cathode of the photovoltaic device;
   c) illuminating the photovoltaic device, to cause plating onto the exposed semiconductor surface of the cathode of the photovoltaic device,
   wherein metal is preferentially sacrificed from the sacrificial metal electrode, rather than from a metal contact of the anode of the photovoltaic device, to form metal ions in the solution of metal ions and ions from the solution of metal ions are reduced to plate the exposed semiconductor surface of the cathode of the photovoltaic device.

10. The method of claim 9 wherein the metal contact of the anode is formed of a metal which is more electropositive than the metal of the sacrificial metal electrode and the anode metal contact is coated with a protective coating to allow the preferential sacrifice of metal from the sacrificial metal electrode.

11. The method of claim 10 wherein the protective coating is an oxide of the metal of the anode metal contact.

12. A method of photoplating a contact onto an exposed semiconductor surface of a cathode of a photovoltaic device, the method comprising:
    a) immersing the exposed semiconductor surface of the cathode of the photovoltaic device in a solution of metal ions, the metal ions being a species which is to be plated onto the cathode of the photovoltaic device;
    b) illuminating the photovoltaic device, to cause plating onto the exposed semiconductor surface of the cathode of the photovoltaic device,
    wherein for any given intensity of illumination falling on the photovoltaic device, resistivity of the solution of metal ions is selected to cause the photovoltaic device to operate at a point on an I-V characteristic curve of the photovoltaic device between a maximum power point voltage and an open circuit voltage.

13. The method of claim 12 wherein the resistivity of the solution of metal ions is selected to cause the photovoltaic device to operate at a point on the I-V characteristic curve of the photovoltaic device which is closer to the open circuit voltage Voc than to the maximum power point voltage.

14. The method as claimed in claim 13 further comprising:
    a) placing a sacrificial metal electrode in electrical contact with an anode of the photovoltaic device the sacrificial metal electrode comprising a metal of the species to be plated onto the cathode of the photovoltaic device;
    b) immersing the exposed semiconductor surface of the cathode of the photovoltaic device and sacrificial metal electrode in a solution of metal ions, the metal ions being of the species which is to be plated onto the cathode of the photovoltaic device;
    c) illuminating the photovoltaic device, to cause plating onto the exposed surface of the cathode of the photovoltaic device,
    wherein metal is preferentially sacrificed from the sacrificial metal electrode, rather than from a metal contact of the anode of the photovoltaic device, to form metal ions in the solution of metal ions and ions from the solution of metal ions are reduced to plate the exposed semiconductor surface of the cathode of the photovoltaic device.

15. The method of claim 14 wherein the metal contact of the anode is formed of a metal which is more electropositive than the metal of the sacrificial metal electrode and the anode metal contact is coated with a protective coating to allow the preferential sacrifice of metal from the sacrificial metal electrode.

16. The method of claim 15 wherein the protective coating is an oxide of the metal of the anode metal contact.

17. A method of photoplating a contact onto an exposed semiconductor surface of a cathode of a photovoltaic device, the method comprising:
   a) placing a sacrificial metal electrode in electrical contact with an anode of the photovoltaic device the sacrificial metal electrode comprising a metal of the species to be plated onto the cathode of the photovoltaic device;
   b) immersing the exposed semiconductor surface of the cathode of the photovoltaic device and sacrificial metal electrode in a solution of metal ions, the metal ions being of the species which is to be plated onto the cathode of the photovoltaic device;
   c) illuminating the photovoltaic device, to cause plating onto the exposed semiconductor surface of the cathode of the photovoltaic device,
   wherein metal is preferentially sacrificed from the sacrificial metal electrode, rather than from a metal contact of the anode of the photovoltaic device, to form metal ions in the solution of metal ions and ions from the solution of metal ions are reduced to plate the exposed surface of the cathode of the photovoltaic device.

18. The method of claim 17 wherein the metal contact of the anode is formed of a metal which is more electropositive than the metal of the sacrificial metal electrode and the anode metal contact is coated with a protective coating to allow the preferential sacrifice of metal from the sacrificial metal electrode.

19. The method of claim 18 wherein the protective coating is an oxide of the metal of the anode metal contact.

20. A method of photoplating a metal contact onto an exposed semiconductor surface of a cathode of a photovoltaic device, the method comprising:
   a) placing a sacrificial metal electrode in electrical contact with an anode of the photovoltaic device, the sacrificial metal electrode comprising a metal of a species to be plated onto the cathode of the photovoltaic device;
   b) immersing the exposed semiconductor surface of the cathode of the photovoltaic device and sacrificial metal electrode in a solution of metal ions, the metal ions being of the species which is to be plated onto the exposed semiconductor surface of the cathode of the photovoltaic device;
   c) illuminating the photovoltaic device, using a light source which has a time varying intensity, to cause plating onto the exposed surface of the cathode of the photovoltaic device,
   wherein metal is preferentially sacrificed from the sacrificial metal electrode, rather than from a metal contact of the anode of the photovoltaic device, to form metal ions in the solution of metal ions and ions from the solution of metal ions are reduced to plate the exposed semiconductor surface of the cathode of the photovoltaic device.

* * * * *